United States Patent
Han et al.

(10) Patent No.: US 9,698,757 B2
(45) Date of Patent: Jul. 4, 2017

(54) ANALOG BASEBAND FILTERING APPARATUS OF MULTIMODE MULTIBAND WIRELESS TRANSCEIVER AND CONTROL METHOD THEREOF

(71) Applicant: Samsung Electronics Co., Ltd., Suwon-si, Gyeonggi-do (KR)

(72) Inventors: Byungki Han, Incheon (KR); Suseob Ahn, Seoul (KR); Jongwoo Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/908,067

(22) PCT Filed: Jul. 24, 2014

(86) PCT No.: PCT/KR2014/006762
§ 371 (c)(1),
(2) Date: Jan. 27, 2016

(87) PCT Pub. No.: WO2015/012620
PCT Pub. Date: Jan. 29, 2015

(65) Prior Publication Data
US 2016/0173063 A1    Jun. 16, 2016

(30) Foreign Application Priority Data

Jul. 26, 2013 (KR) .................. 10-2013-0089026

(51) Int. Cl.
*H03H 11/12* (2006.01)
*H03H 11/04* (2006.01)
(Continued)

(52) U.S. Cl.
CPC ......... *H03H 11/12* (2013.01); *H03H 11/0405* (2013.01); *H03H 11/0455* (2013.01);
(Continued)

(58) Field of Classification Search
CPC ........... H03H 11/0405; H03H 11/0455; H03H 11/12; H03H 11/1252; H03H 11/1291; H04L 25/03
See application file for complete search history.

(56) References Cited

U.S. PATENT DOCUMENTS 5,790,587 A * 8/1998 Smith ................ H04W 52/08
                                                375/147
6,584,304 B1 * 6/2003 Robinett ............... H04B 1/005
                                                455/188.1
(Continued)

FOREIGN PATENT DOCUMENTS

EP          0813312 A2    12/1997
KR   10-2012-0011002 A    2/2012
(Continued)

OTHER PUBLICATIONS

Kang-Yoon Lee, "Multi-Mode, Multi-Band Active-RC Filter and Tuning Circuits for SDR Applications", InTech, XP055348110, Apr. 1, 2010, pp. 95-106.

*Primary Examiner* — Jeffrey Zweizig
(74) *Attorney, Agent, or Firm* — Jefferson IP Law, LLP

(57) ABSTRACT

The ABB blocks 332, 334, 336, and 318 are configured to process the I/Q signals corresponding to the first or the second HB independently or the I/Q signals corresponding to the LB in cooperation by two. In detail, the first ABB I block 332 and the first ABB Q block 334 operate independently in the 3G/4G mode but they are configured to process the I signal (or Q signal) of the LB in the 2G mode. Likewise, the second ABB Q block 336 and the second ABB I block 318 operate independently in the 3G/4G mode but they are configured to process the Q signal (or I signal) of the LB in the 2G mode. The first ABB I/Q blocks 332 and 334 and the second ABB I/Q blocks 336 and 318 are arranged symmetrically to processing the I/Q signals cooperatively in the 2G mode. In detail, the second ABB Q block 336 is arranged close to the first ABB Q block 334 such that the capacitor regions included in the first ABB I/Q blocks (Continued)

332 and 334 are connected to each other and the capacitor regions included in the second ABB I/Q blocks 336 and 338 are connected to each other.

14 Claims, 13 Drawing Sheets

(51) Int. Cl.
*H04L 25/03* (2006.01)
*H03H 7/24* (2006.01)

(52) U.S. Cl.
CPC ..... *H03H 11/1252* (2013.01); *H03H 11/1291* (2013.01); *H04L 25/03* (2013.01); *H03H 7/24* (2013.01); *H03H 2011/0494* (2013.01)

(56) References Cited

U.S. PATENT DOCUMENTS

| 6,714,760 | B2* | 3/2004 | Robinett | H04B 1/005 455/3.02 |
| 7,082,294 | B2* | 7/2006 | Denis | H03J 5/244 331/11 |
| 7,116,952 | B2* | 10/2006 | Arafa | H04B 7/0805 455/132 |
| 8,422,539 | B2 | 4/2013 | Lai et al. | |
| 8,489,051 | B2* | 7/2013 | Mo | H04B 1/18 455/188.1 |
| 8,570,139 | B2 | 10/2013 | Lee | |
| 9,002,304 | B2* | 4/2015 | Lee | H03H 11/1291 327/355 |
| 9,306,616 | B2* | 4/2016 | Lee | H03H 11/1291 |
| 2004/0209591 | A1 | 10/2004 | Martin et al. | |
| 2008/0096514 | A1 | 4/2008 | Rahman et al. | |
| 2011/0230156 | A1 | 9/2011 | Mehrmanesh et al. | |
| 2012/0019405 | A1 | 1/2012 | Nadimpalli et al. | |
| 2012/0322502 | A1 | 12/2012 | Song et al. | |
| 2013/0052973 | A1 | 2/2013 | Mo et al. | |

FOREIGN PATENT DOCUMENTS

| WO | 03-090370 A1 | 10/2003 |
| WO | 2005-055446 A1 | 6/2005 |

\* cited by examiner

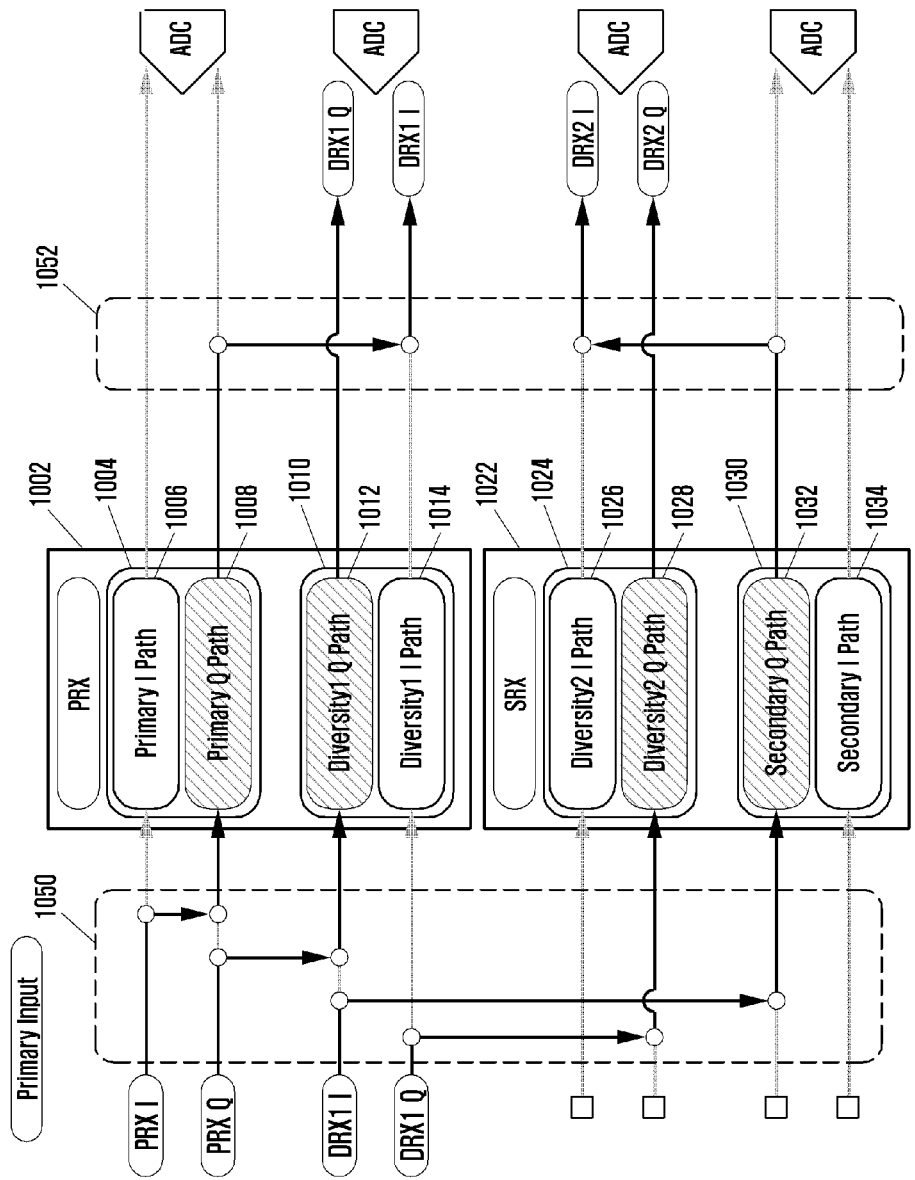

ANALOG BASEBAND FILTERING APPARATUS OF MULTIMODE MULTIBAND WIRELESS TRANSCEIVER AND CONTROL METHOD THEREOF

TECHNICAL FIELD

The present invention relates to a wireless communication system and, in particular, to a filtering apparatus of a multimode multiband transceiver for filtering a signal carrying an analog baseband signal and a control method thereof.

BACKGROUND ART

A wireless communication receiver uses an analog filter to select the signal of the intended channel by removing unnecessary noise from the signal demodulated to baseband by a mixer. The accurate cutoff frequency configuration for the analog filter exerts significant influences to the system performance.

Typically, a filter has an input-to-output gain varying, as the frequency increases, and is provide with a pass band and a stop band. The term 'cutoff frequency (fc)' denotes a boundary frequency between the pass band and the stop band. In the case of Low Pass Filter (LPF), the cutoff frequency (fc) is defined as a frequency having a gain which is 3 dB lower than then gain of the direct current or low frequency in the pass band. The cutoff frequency (fc) is determined by a feedback resister and a feedback capacitor used in the analog filter.

The baseband covers a very broad range including 100 kHz bandwidth for the 2nd Generation (2G) communication system and 20 MHz bandwidth for the 3rd Generation (3G) and 4th Generation (4G) communication system, and the broadest bandwidth is about 100 times the narrowest one. A multimode mobile terminal designed to operate in a 2G mode for voice communication and in a 3G or 4G mode (hereinafter, referred to as 3G/4G mode) has to have a multimode multiband radio transceiver equipped with an analog baseband filter capable of supporting various bandwidths as aforementioned.

However, since the resistance and capacitance values determining the cutoff frequency of the analog baseband filter vary depending on the temperature and process conditions and are difficult to estimate accurately, the cutoff frequency is likely to differ from the target value in the real environment. Accordingly, the cutoff frequency is compensated by controlling a variable resister or a variable capacitor using a digital algorithm under the condition that the error has to be within the range of 4%.

Since the cutoff frequency is inversely proportional to the resistance and the capacitance, there is a need of the resistor having a large resistance and the capacitor having a large capacitance to process the low band signal of the legacy system such as 2G system. The capacitor for processing the low band signal of the 2G system is a few times larger in size than that for processing the 3/4G band signal and thus increases the circuit area of the analog filter. This means that the circuit area of the analog filter increases due to the disabled 2G mode in the state that the 3/4G mode is enabled, resulting in increase of manufacturing costs. The increased circuit area also elongates the wire length so as to increase signal error and noise, resulting in degradation of signal characteristics.

DISCLOSURE OF INVENTION

Technical Problem

The present invention provides an analog signal filtering apparatus of a radio transceiver and a control method thereof.

Also, the present invention provides a variable gain amplifier and a variable frequency filter capable of processing various frequency bands signals in a single structure.

Also, the present invention provides an analog signal filtering apparatus having an analog baseband filter of which circuit area is minimized for use in multimode multiband environment and a control method thereof.

Also, the present invention provides an analog signal filtering apparatus of a multimode multiband radio transceiver that is capable of sharing capacitor on a diversity pass and enhancing the input and feedback resisters structures and a control method thereof.

Also, the present invention provides an analog signal filtering apparatus of a multimode multiband receiver that is capable of using a plurality of concatenated analog baseband filters and a control method thereof.

Furthermore, the present invention provides an analog signal filtering apparatus of a multimode multiband receiver that is capable of support Carrier Aggregation (CA) and a control method thereof.

Solution to Problem

In accordance with an aspect of the present invention, a filtering apparatus of a multimode multiband radio transceiver is provided. The filtering apparatus includes a filtering unit which filters Radio Frequency (RF) signals on one of at least one frequency bands, a switching unit which switches the signals among at least one filter block included in the filtering unit according to a selected communication mode, and a controller which selects the communication mode and controls the switching unit.

In accordance with another aspect of the present invention, a method for controlling a filtering apparatus of a multimode multiband radio transceiver is provided. The method includes receiving, at a filtering unit including at least one filter block, Radio Frequency (RF) signal on at least one frequency bands, determining a communication mode based on the received signal, switching the signal among at least one filter block included in the filtering unit according to the communication mode, and filtering and amplifying, at the filtering unit, the signal.

Advantageous Effects of Invention

The analog signal filtering apparatus and method of the present invention is advantageous in terms of providing a variable gain amplifier, filter circuit, and algorithm capable of fulfilling the gains and bandwidths required by the baseband receiver for all mobile communication standards complied by 2G, 3G, and 4G systems.

Also, the analog signal filtering apparatus and method of the present invention is advantageous in terms of implementing the various circuit structures capable of decreasing manufacturing costs and enhancing noise cancellation by decreasing the circuit area as compared to the convention technologies and facilitating application of Multiple Input Multiple Output (MIMO) receiver configurations such as 4×2, 4×4, and 8×4 antenna configurations.

Also, the analog signal filtering apparatus and method of the present invention is advantageous in terms of providing a filter circuit for communication circuit design supporting Carrier Aggregation (CA) for use of carriers on multiple frequency bands.

BRIEF DESCRIPTION OF DRAWINGS

FIGS. 10A to 10C are diagrams illustrating the operation mechanisms of the filter according to an embodiment of the present disclosure.

MODE FOR THE INVENTION

Figure 1:
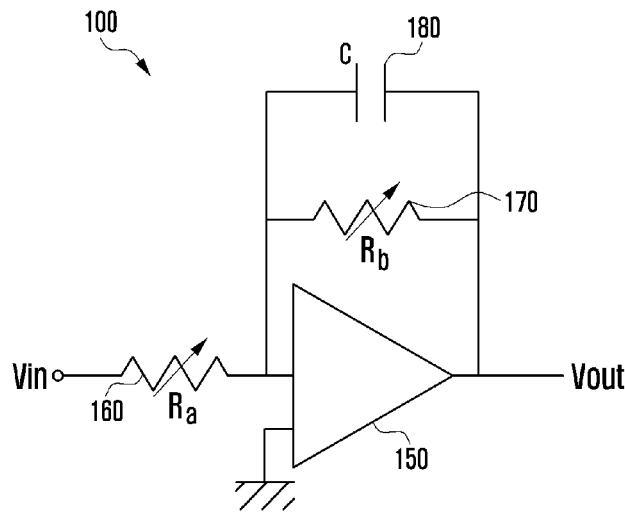
FIG. 1 is a circuit diagram illustrating a configuration of an analog filter having a characteristic function of the first order filter.

Exemplary embodiments of the present invention are described with reference to the accompanying drawings in detail.

Detailed description of well-known functions and structures incorporated herein may be omitted to avoid obscuring the subject matter of the present invention. This aims to omit unnecessary description so as to make the subject matter of the present invention clear.

For the same reason, some of elements are exaggerated, omitted or simplified in the drawings and the elements may have sizes and/or shapes different from those shown in drawings, in practice. The same reference numbers are used throughout the drawings to refer to the same or like parts.

Detailed description of well-known functions and structures incorporated herein may be omitted to avoid obscuring the subject matter of the present invention. Further, the following terms are defined in consideration of the functionality in the present invention, and may vary according to the intention of a user or an operator, usage, etc. Therefore, the definition should be made on the basis of the overall content of the present specification.

The present invention is not limited by exemplary embodiments provided in the drawings and the specification. Throughout the drawings, like reference numerals refer to like members. The drawings have been simplified and relatively exaggerated to emphasize the features of the present invention, and dimensions in the drawings do not accurately match the dimensions of actual products of the present invention. Those of ordinary skill in the art may easily modify dimensions, such as length, circumference, and thickness, of each component from the disclosure of the drawings for application into an actual product, and it will be obvious to those of ordinary skill in the art that such modification falls within the scope of the present invention.

The following embodiments of the present invention relates to an analog filter for filtering analog signal and, in particular, to a multimode multiband analog baseband filter. The Analog Baseband (ABB) filter may be used for a radio transceiver supporting radio communication technologies with various bandwidths such as Global System for Mobile communications (GSM), Enhanced Data GSM Environment (EDGE), High Speed Packet Access (HSPA). Wideband Code Division Multiple Access (WCDMA), Long Term Evolution (LTE) 1.4M, LTE 3M, LTE 5M, LTE 10M, LTE 15M, and LTE 20M.

FIG. 1 is a circuit diagram illustrating a configuration of an analog filter having a characteristic function of the first order filter.

Referring to FIG. 1, the analog filter 100 includes an Operational Amplifier (OP AMP) 150 which receives the input voltage Vin through its negative terminal via the input resistor Ra 160 and of which positive terminal is grounded, a feedback resister Rb 170 connecting the negative input terminal of the OP AMP 150 and the output terminal Vout of the analog filter 100 in parallel, and a feedback capacitor C 180. The resistors 160 and 170 and variable registers of which resistances can be varied to adjust the gain and cutoff frequency of the analog filter 100. The gain and cutoff frequency of the direct current of the analog filter 100 are expressed as equation (1):

$$\text{Gain}:R_b/R_a, f_c:1/(2\pi R_b C) \quad (1)$$

In equation (1), Ra denotes the resistance of the input resistor 160, Rb denotes the resistance of the feedback resistor 170, and C denotes the capacitance of the feedback capacitor 180. The cutoff frequency is inversely proportional to the feedback resistance Rb and the feedback capacitance C. Here, the Rb and C have the characteristics of increasing linearly or exponentially under the control with a digital code.

The reception filter applicable to a Radio Frequency (RF) circuit is implemented as a 3 to 7-stage filter by combining in series a Real Pole (RP) filter having one RP and a plurality of (e.g. 2 to 6) bi-quad (BQ) filter(s) having one or more RPs.

The baseband covers diverse bandwidths including 100 kHz bandwidth for the 2G system such as GSM and 10 MHz bandwidth for the 4G system such as LTE. Table 1 shows the examples of cutoff frequencies for standardized mobile communication basebands.

TABLE 1

| Stan- | 2G | | 3G | | 4G | | | | | |
| | | | HSPA | HSPA | | | | | | |
| dard | GSM | EDGE | SC | DC | LTE1.4 | LTE3 | LTE5 | LTE10 | LTE15 | LTE20 |
| Band-width | 100 kHz | 100 kHz | 1.92 MHz | 4.42 MHz | 615 kHz | 1.5 MHz | 2.5 MHz | 5 MHz | 7.5 MHz | 10 MHz |

Here, HSPA SC denotes Single Carrier HSPA, and HSPA DC denotes Dual Carrier HSPA. In the 3G/4G mode, it is possible to use extra frequency band for diversity with additional receive antennas as well as the frequency band for basically used receive antenna. In the present invention, the two frequencies are referred to as primary (PRX) High Band (HB) and diversity (DRX) HB.

Figure 2A:
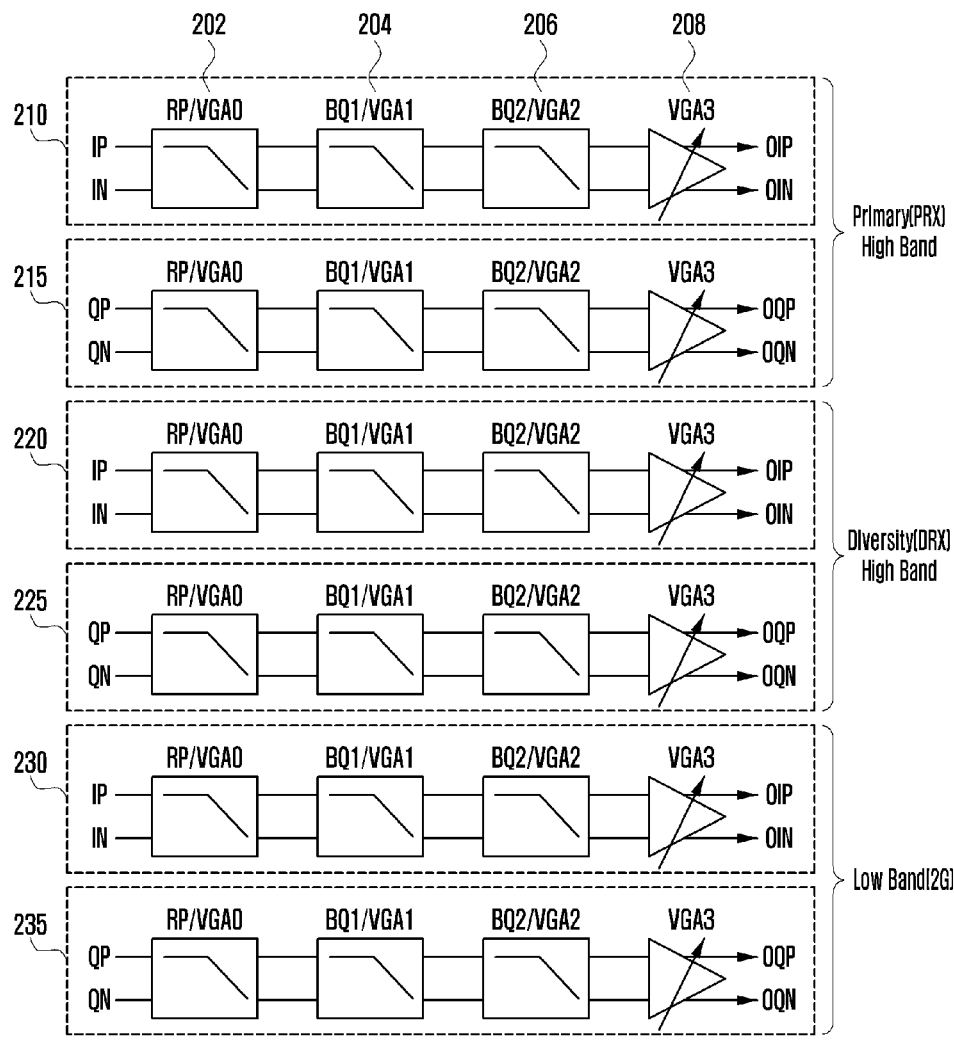
FIGS. 2A and 2B are a block diagram and a floor plan diagram illustrating the analog baseband filter.
Figure 2B:
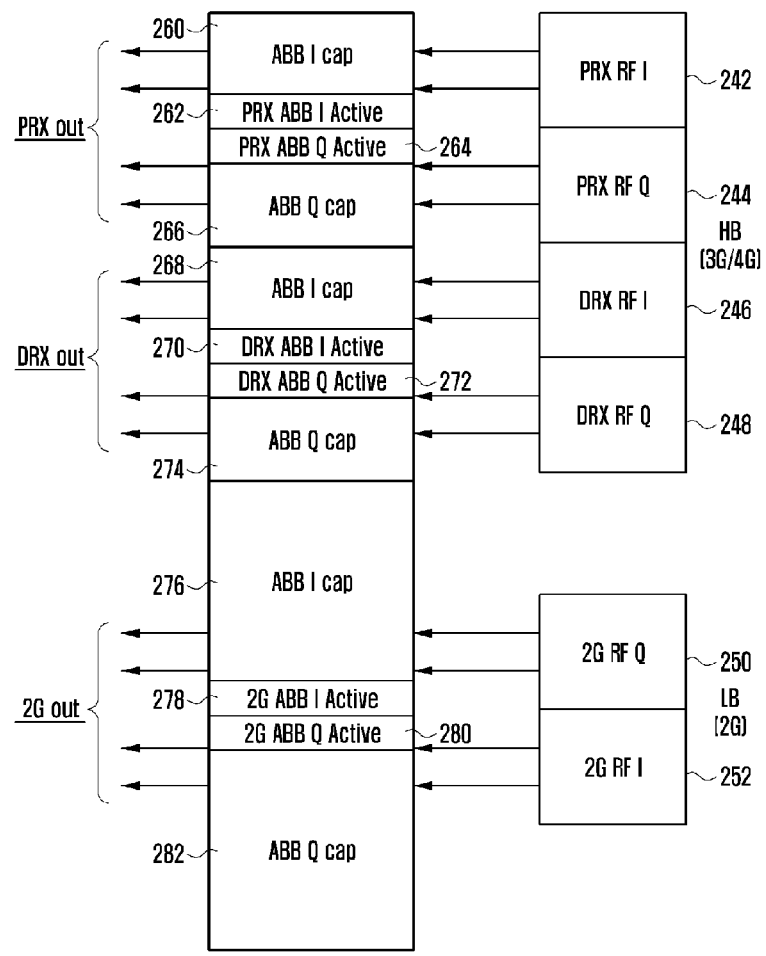

FIGS. 2A and 2B are a block diagram and a floor plan diagram illustrating the analog baseband filter.

Referring to FIG. 2A, the analog baseband filter includes the first and second filtering and amplifying paths 210 and 215 for In phase (I) signal and Quadrature phase (Q) signal of the 3G/4G mode PRX HB, the third and fourth filtering and amplifying paths 220 and 225 for I and Q signals of the 3G/4G mode DRX HB, and the fifth and sixth filtering and amplifying paths 230 and 235 for I and Q signals of the 2G mode Low Band (LB).

Each of the filtering/amplifying paths 210 to 235 forms an I/Q chain for filtering and amplifying (hereinafter, referred to as filtering/amplifying) the I or Q signal. In detail, the first filtering/amplifying path 210 includes a RP filter 202 connected to the positive input (IP) and negative input (IN) of the I signal of the PRX HB, a first BQ filter 204, a second BQ 206, and a Variable Gain Amplifier (VGA) 208 connected to an IP output (OIP) and an IN Output (OIN). The RP filter 202, the first and second BQ filters 204 and 206, and the VGA 208 are connected in series. Like the first filtering/amplifying path 210, the second filtering/amplifying path 215 includes three filters and VGA, receives the input of QP and QN, and outputs OQP and OQN. Likewise, each of the other filtering/amplifying paths 220 to 235 includes three filters and VGA connected in series.

FIG. 2B is a floor plan diagram illustrating the circuit corresponding to the analog baseband filtering/amplifying paths 210 to 235 of FIG. 2A. The drawing shows the connection relationship between the filtering/amplifying paths 210 to 235 and the RF units inputting I/Q signals to the filtering/amplifying paths 210 to 235 and internal arrangements of the respective filtering/amplifying paths 210 to 235.

Referring to FIG. 2B, the PRX RF I unit 242 receives the RF signal of the PRX HB, converts the signal to a baseband I signal, and sends the I signal to the first filter block 260 and 262 which is equivalent to the first filtering/amplifying path 210 of FIG. 2A. The PRX RF Q unit 244 receives the Q signal of the PRX HB and sends the Q signal to the second filter block 264 and 266, the DRX RF I unit 246 receives the I signal of the DRX HB and sends the I signal to the third filter block 268 and 270, and the DRX RF Q unit 248 receives the Q signal of the DRX HB and sends the Q signal to the fourth filter block 272 and 274. Likewise, the filter block 264 to 274 are equivalent to the second to fourth filtering/amplifying paths 215 to 225 of FIG. 2A.

The 2G RF Q unit 250 receives the RF signal of the 2G LB, down-converts the RF signal to the baseband Q signal, and sends the Q signal to the fifth filter block 276 and 278 which is equivalent to the fifth filtering/amplifying paths 230 of FIG. 2A. The 2G RF I unit 252 receives the RF signal of the 2G LB, down-converts the RF signal to the baseband I signal, and sends the I signal to the sixth filter block 280 and 282 which is equivalent to the sixth filtering/amplifying path 235 of FIG. 2A.

The devices constituting the filter block 210 of FIG. 2A are classified into passive devices such as resistors and capacitors and active devices such as OP AMP. The first filter block includes the capacitor region 260 including capacitor banks and resistors and an active region 262 including the OP AMPs. Likewise, the second to sixth filter blocks 2640 to 282 include the respective capacitor regions 266, 268, 274, 276, and 282 and the respective active regions 264, 270, 272, 278, and 280. For facilitating circuit fabrication, it is typical that the adjacent filter blocks are configured such that the identical regions are positioned closely. For example, the active region of the first filter block is arranged close to the active region of the second filter block, the capacity region 266 of the second filter block close to the capacitor region 268 of the third filter block, and the active region 270 of the third filter block close to the active region 272 of the fourth filter block. Likewise, the capacitor region 274 of the fourth filter block is arranged close to the capacitor region 276 of the fifth filter block for the 2G mode, and the active region 278 of the fifth filter block close to the active region 280 of the sixth filter block. That is, the I and Q paths of each band are arranged symmetrically on the floor plan.

As described above, since the cutoff frequency is inversely proportional to the product of the resistance and capacitance, there is a need of a resistor having a very large resistance and a capacitor having a very large capacitance to process the low band signal of legacy system such as 2G system and, as a consequence, the circuit areas of the capacitor regions 276 and 282 of the fifth and sixth filter blocks for the 2G mode are very large as compared to the capacitor regions 260, 266, 268, and 274 for the 3G/4G mode. Depending on the embodiment, the filter blocks for the 2G mode may be about two times larger in area than the filter blocks for the 3G/4G mode.

If the diverse ranges of the baseband are processed by controlling the resistances of the resistors instead of using the capacitors occupying large area, this makes it possible to decrease the circuit area but causes a problem of increasing the noise. In detail, the noise occurring in the real wireless environment is proportional to the input resistance of the first filter 202 as shown in equation (2) and multiplied with the gain to be reflected the output signals of OIP and OIN.

$$V_N^2 = 4kTR \cdot BW \quad (2)$$

In equation (2), $V_N$ denotes noise voltage, k denotes Boltzmann constant ($=1.38*10^{-23}$ J/K), T denotes absolute temperature, R denotes input resistance of the first filter 202, and BW denotes bandwidth.

The Noise Figure required for the analog baseband filter is equal to or less than 30 dB and corresponds to the noise occurring with the resistance of 50 kΩ which is 1000 times larger than the reference resistance of 50Ω. Accordingly, the input resistance of each filter cannot be equal to or greater than 50 kΩ. Also, since the gain of each filter is in the range of 0 to 24 dB (1~16 times), the feedback resister has the resistance of 1/16~1 the input resistance and requires the frequency ranges 100 times larger for processing the bandwidths of the 2G and 4G systems as described above and thus the 1600 times large gain range is required to achieve the intended cutoff frequency only through controlling the resistance. Also, in order to achieve the 24 dB gain in the course of using the input resistor of 500Ω which is 1/100 the maximum resistance of 50 kΩ of the input resister, the feedback resister has to have the resistance of at most 31.255 and thus the output impedance drops significantly, resulting in failure of achieving the intended gain and deterioration of signal distortion.

The following embodiment of the present invention proposes an analog baseband filter circuit capable of using the signal chains for the frequency bands of the High Band (HB) mode in the Low Band (LB) mode. In an example, the Q channel signal paths for the PRB HB and DRX HB of the HB mode are shared for use in the LB mode. In another example, the I channel signal paths for the PRB HB and DRX HB of the HB mode are shared for use in the LB mode.

Figure 3A:
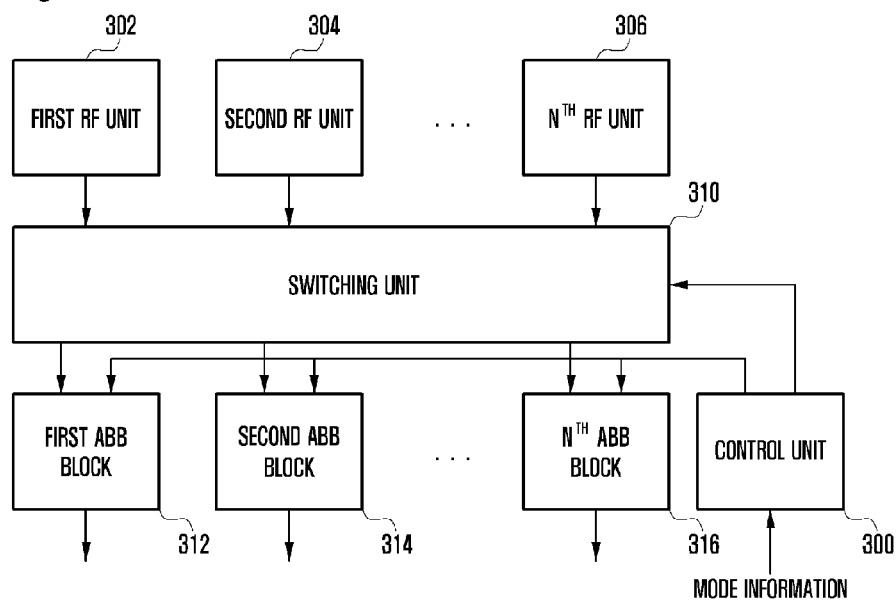
FIG. 3A is a block diagram illustrating a configuration of a receiver supporting a plurality HB modes according to an embodiment of the present invention.

FIG. 3A is a block diagram illustrating a configuration of a receiver supporting a plurality HB modes according to an embodiment of the present invention.

Referring to FIG. 3A, the receiver includes a plurality of RF units 302, 304, and 306 for processing HB or LB signals; a plurality of analog baseband (ABB) blocks 312, 314, and 316 for processing baseband signals; a switching unit 310 for connecting the RF units 302, 304, and 360 and the ABB blocks 312, 314, and 316 selectively; and a control unit 300 for controlling the switching unit 310 according to the selected communication mode.

The RF units 302, 304, and 306 perform RF processing for I or Q path of the frequency band according to the selected communication mode. In an embodiment, the first RF unit 302 is configured to process the first HB signal and the LB signal, converts the received HB RF signal to baseband I or Q signal in the HB mode, and converts the received LB RF signal to I or Q signal in the LB mode.

Each of the ABB blocks 312, 314, and 316 is configured to process the baseband signal corresponding to the respective HBs or to process the baseband signal corresponding to the LB in cooperation with neighboring ABB block. In an example, the first and second ABB blocks 312 and 314 operate independently in the HB mode but are concatenated in the LB mode to process the LB signals. Depending on the embodiment, the first and second ABB blocks 312 and 314 are arranged symmetrically to processing the LB signals together. In detail, the capacitor region of the first ABB block 312 is arranged close to the capacitor region of the second ABB block 314 such that the capacitor regions of the first and second ABB blocks 312 and 314 are connected to each other in the LB mode. According to an embodiment, the first and second ABB blocks 312 and 314 are connected such that the combined capacitance increases in proportional to the each of the capacitances of the capacitors.

The switching unit 310 connects the RF units 302, 304, and 306 to the ABB blocks 312, 314, and 316 selectively according to the selected communication mode under the control of the control unit 300. The control unit 300 manages the overall operations of the receiver and controls the switching unit 310 depending on whether the communication mode is the LB mode or the HB mode. In detail, the switching unit 310 connects the first RF unit 302 to the first ABB block 312, the second RF unit 304 to the second ABB block 314, and the $N_{th}$ RF unit 306 to the $N_{th}$ ABB block.

In the LB mode, if the first RF unit 302 is configured to receive the LB RF signal, the switching unit 310 connects the first RF unit 302 to the second ABB block 314, and the capacitor region of the second ABB block 314 is extended to include the capacitor region of the first ABB block 312. For this extension, the capacitor region of the second ABB block 314 is arranged close to the capacitor region of the first ABB block 312 such that the two capacitor regions are concatenated to process (filter and amplify) the baseband signal corresponding to the LB. Likewise, at least two other ABB blocks may be connected to different RF units to process the baseband signal of the LB.

According to an embodiment, the mode information transmitted to the control unit may be determined based on the signal reception result of the modem unit of the receiver. The modem unit may be positioned at the ABB block output end.

Figure 3B:
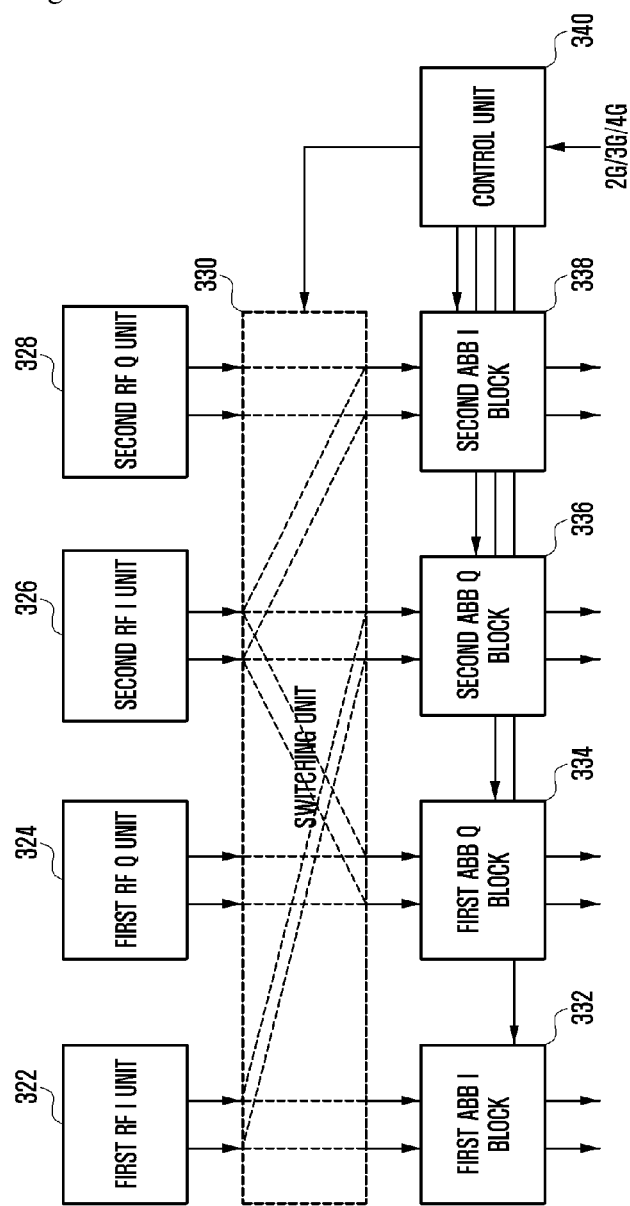
FIG. 3B is a diagram illustrating a configuration of the terminal supporting the first and second HB modes according to an embodiment of the present invention.

FIG. 3B is a diagram illustrating a configuration of the terminal supporting the first and second HB modes according to an embodiment of the present invention.

Referring to FIG. 3B, the terminal includes two first RF units 322 and 324 for the first HB I/Q paths, two second RF units 326 and 328 for the second HB I/Q paths, two first ABB blocks 332 and 334 for the baseband I/Q paths corresponding to the first HB, two second ABB blocks 336 and 338 for the baseband I/Q paths corresponding to the second HB, a switching unit 330 connecting the RF units 322, 324, 326, and 328 to the ABB blocks 332, 334, 336, and 328, and a control unit 340 for controlling the switching unit 330 according to the communication mode.

The first RF I unit 322 and the first RF Q unit 324 for the I path of the first HB are configured so as to operate as an RF unit for I or Q path of the LB. Alternatively or additionally, the second RF I unit 326 and the second RF Q unit 328 for the I path of the second HB may be configured so as to operate as the RF unit for the I or Q path of the LB. In the case that the terminal operates in the 2G mode, the first RF I/Q units 322 and 324 or the second RF I/Q units 326 and 328 are responsible for receiving the RF signal and converts the RF signal to the baseband I/Q signals. In the case that the terminal operates in the 3G/4G mode, the first RF I/Q units 322 and 324 is responsible of receiving the RF signals of the first HB and converting the RF signals to the baseband I/Q signals, and the second RF I/Q units 326 and 328 are responsible for receiving the RF signals of the second HB and converts the RF signals to the baseband I/Q signals.

The ABB blocks 332, 334, 336, and 318 are configured to process the I/Q signals corresponding to the first or the second HB independently or the I/Q signals corresponding to the LB in cooperation by two. In detail, the first ABB I block 332 and the first ABB Q block 334 operate independently in the 3G/4G mode but they are configured to process the I signal (or Q signal) of the LB in the 2G mode. Likewise, the second ABB Q block 336 and the second ABB I block 318 operate independently in the 3G/4G mode but they are configured to process the Q signal (or I signal) of the LB in the 2G mode. The first ABB I/Q blocks 332 and 334 and the second ABB I/Q blocks 336 and 318 are arranged symmetrically to processing the I/Q signals cooperatively in the 2G mode. In detail, the second ABB Q block 336 is arranged close to the first ABB Q block 334 such that the capacitor regions included in the first ABB I/Q blocks 332 and 334 are connected to each other and the capacitor regions included in the second ABB I/Q blocks 336 and 338 are connected to each other.

The switching unit 330 connects the RF units 322, 324, 326, and 328 to the ABB blocks 332, 334, 336, and 318 according to the selected communication mode under the control of the control unit 340. The control unit manages the overall operations of the terminal and controls the switching unit 330 depending on whether the communication mode is the 2G mode or the 3G/4G mode. In detail, the switching unit 330 connects the first RF I unit 322 to the first ABB I block 332, the first RF Q unit 324 to the first ABB Q block 334, the second RF I unit 326 to the second ABB I block 318, and the second RF Q unit 328 to the second ABB Q block 336.

If the first RF I/Q units 322 and 324 are configured to receive the RF signals of the 2G LB in the 2G mode, the switching unit 330 connects the first RF Q unit 324 to the first ABB Q block 334, and the capacitor region of the first ABB Q block 334 is extended to include the capacitor region of the first ABB I block 332. For this extension, the capacitor region of the first ABB Q block 334 is arranged close to the capacitor region of the first ABB I block. The switching unit also connects the first RF I unit 322 to the second ABB Q block 336, and the second ABB Q block 336 is extended to include the capacitor region of the second ABB I block 318. For this extension, the capacitor region of the second ABB Q block 336 is arranged close to the capacitor region of the second ABB I block 318.

In another embodiment, if the second RF I/Q units 326 and 328 are configured to receive the RF signals of the 2G LB in the 2G mode, the switching unit 330 connects the second RF I unit 326 to the first ABB Q block 334, and the capacitor region of the first ABB Q block 324 is extended to include the capacitor region of the first ABB I block 332. The switching unit 330 connects the second RF Q unit 328 to the second ABB Q block 336, and the capacitor region of the second ABB Q block 336 is extended to include the capacitor region of the second ABB I block 338.

According to an embodiment, the mode information transmitted to the control unit may be determined based on the signal reception result of the modem unit of the receiver. The modem unit may be positioned at the ABB block output end.

Figure 4A:
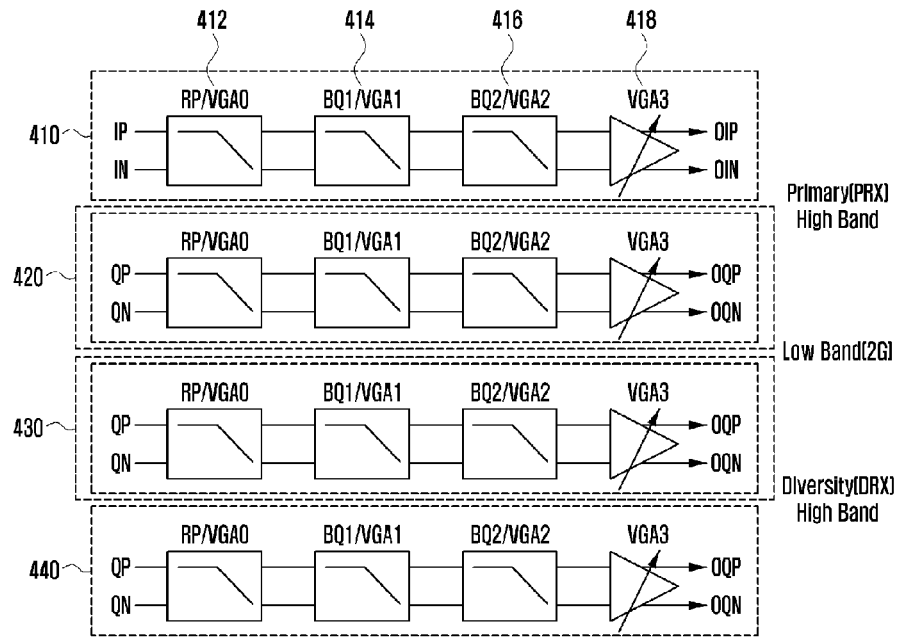
FIGS. 4A and 4B are a block diagram and a floor plan diagram illustrating the analog baseband filter according to an embodiment of the present invention.
Figure 4B:
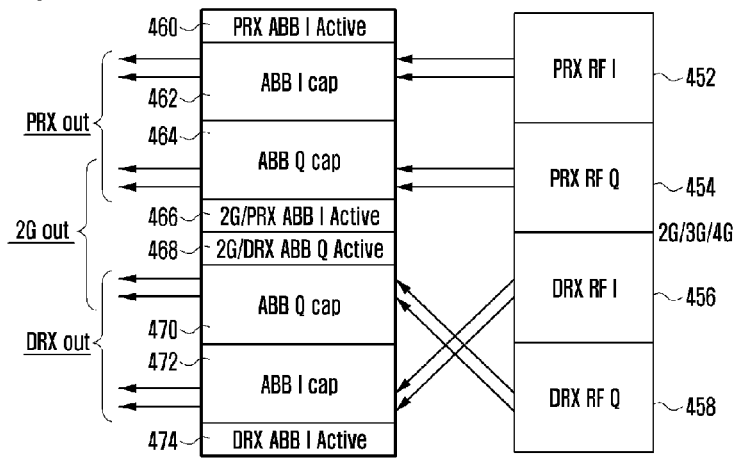

FIGS. 4A and 4B are a block diagram and a floor plan diagram illustrating the analog baseband filter according to an embodiment of the present invention.

Referring to FIG. 4A, the analog baseband filter includes a first filtering/amplifying path 410 for the I signal of the 3G/4G mode PRX HB, a second filtering/amplifying path 420 shared for the Q signal of the PRX HB and the I/Q signals of the LB, a third filtering/amplifying path 430 shared for the Q signal of the DRX HB and the Q/I signals of the LB, and the fourth filtering/amplifying path 440 for the I signal of the DRX HB.

Each of the filtering/amplifying paths 410, 420, 430, and 440 includes an RP filter 412 connected to the positive input and negative inputs, a first BQ filter 414, a second BQ filter 416, and a variable gain amplifier (VGA) 418 connected to the positive and negative outputs.

As described above, the filtering/amplifying paths 420 and 430 of the primary Q channel and diversity Q channel are configured so as to be used for filtering/amplifying in the 2G mode. That is, the filtering/amplifying paths 420 and 430 are shared for the primary and diversity Q channels and the I and Q channels of the 2G mode. In another embodiment, the filtering/amplifying paths may be shared for the primary/diversity I channels and the channels of the 2G mode and this may be practiced by those skilled in the art based on the drawings and the description made hereinafter.

The filtering/amplifying paths 430 and 420 of the diversity I and Q channels are arranged across each other and thus the filtering/amplifying path 430 of the diversity Q channel is positioned close to the filtering/amplifying path 420 of the primary Q channel such that the I and Q channel paths of the 2G mode are arranged close even when the filtering/amplifying paths 420 and 430 operate in the 2G mode.

FIG. 4B is a floor plan diagram illustrating the circuit corresponding to the analog baseband filtering/amplifying paths 410 to 440 of FIG. 4A. The drawing shows the connection relationship between the filter blocks 460 to 474 corresponding to the filtering/amplifying paths and RF units 452, 454, 456, and 458 and the internal arrangements of the respective filter blocks 460 to 474.

FIG. 4B shows the PRX RF I unit 452 and PRX RF Q unit 454 for the I and Q signals of the PRX HB and the DRX RF I unit 456 and DRX RF Q unit 458 for the I and Q signals of the DRX HB. All or at least two of the PRX RF I and Q units 452 and 454 and the DRX I and Q units 456 and 458 are configured so as to be capable of processing the I and Q signals of the 2G mode.

In the 3G/4G mode, the PRX RF I unit 452 receives the RF signal of the PRX HB, converts the RF signal to the baseband I signal, and sends the I signal to the corresponding first filter block 460 and 462. The PRX RF Q unit 454 receives the Q signal of the PRX HB and sends the Q signal to the corresponding second filter block 464 and 466, the DRX RF I unit 456 receives the I signal of the DRX HB and sends the I signal to the corresponding third filter block 468 and 470, and the DRX RF Q unit 458 receives the Q signal of the DRX HB and sends the Q signal to the fourth filter block 472 and 474. In the 2G mode, the PRX RF I and Q units 452 and 454 or the DRX RF I and Q units 456 and 458 receives the RF signals of the 2G LB, converts the RF signal to baseband I and Q signals, and send the I and Q signals to the corresponding second and third filter blocks 464, 466, and 468, and 470; and the capacitor regions 464 and 470 of the second and third filter blocks are extended to include the capacitor regions of other neighboring filter blocks.

The filter blocks 460 to 474 are configured to be equivalent to the filtering/amplifying units 410 to 440 of FIG. 4A. The first filter block is made up of the active region 460 including a resistor and active devices such as OP AMP and a capacitor region 462 including capacitors and equivalent to the first filtering/amplifying path 410 of FIG. 4A. The second filter block is made up of a capacitor region 464 and an active region 466 and equivalent to the second filtering/amplifying path 420 of FIG. 4A. The capacitor region 464 of the second filter block is arranged close to the capacitor region 462 of the first filter block so as to be connected to the capacitor region 462 of the first filter block in the 2G mode, resulting in extension of the capacitance. The third filter block is made up of an active region 468 and a capacitor region 470 and equivalent to the third filtering/amplifying path 430 of FIG. 4A. The fourth filter block is made up of a capacitor region 472 and an active region 474 and equivalent to the fourth filtering/amplifying path 440 of FIG. 4A. The capacitor region 470 of the third filter block is arranged close to the capacitor region 472 of the fourth filter block so as to be connected to the capacitor region 472 of the fourth filter block in the 2G mode, resulting in extension of capacitance.

As described above, the capacitor regions of two filter blocks are arranged close each other so as to be connected to make it possible to process the signals of the 2G mode.

Figure 5A:
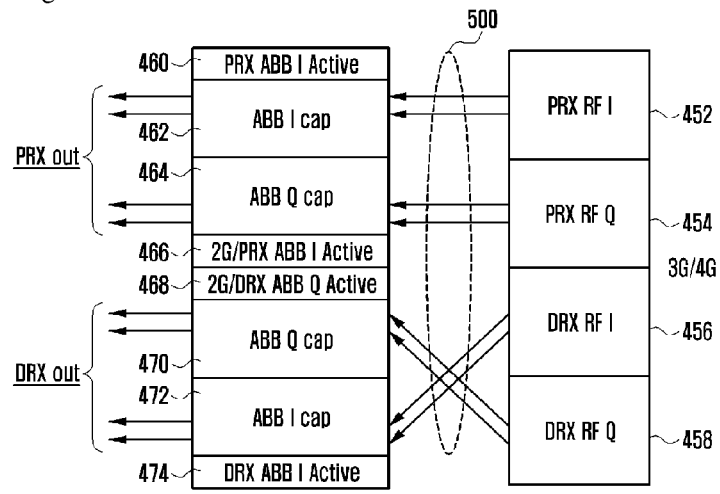
FIGS. 5A to 5C are diagrams illustrating the mode switching of the analog filter according to an embodiment of the present invention.
Figure 5B:
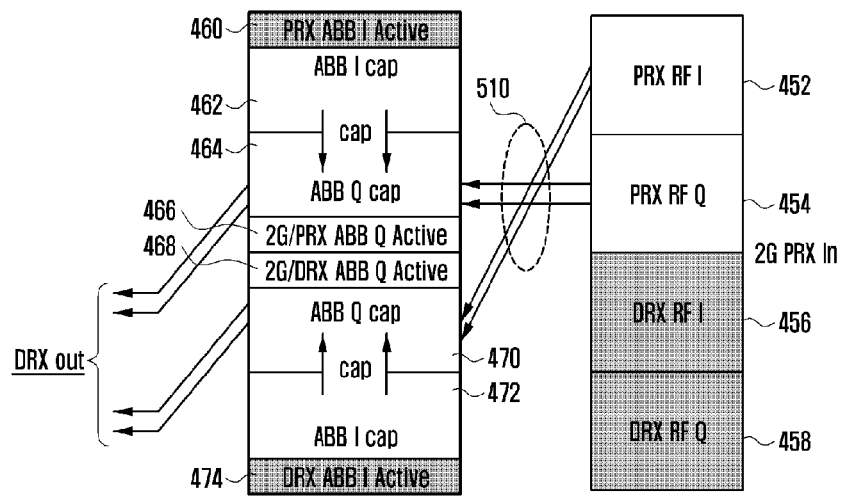
Figure 5C:
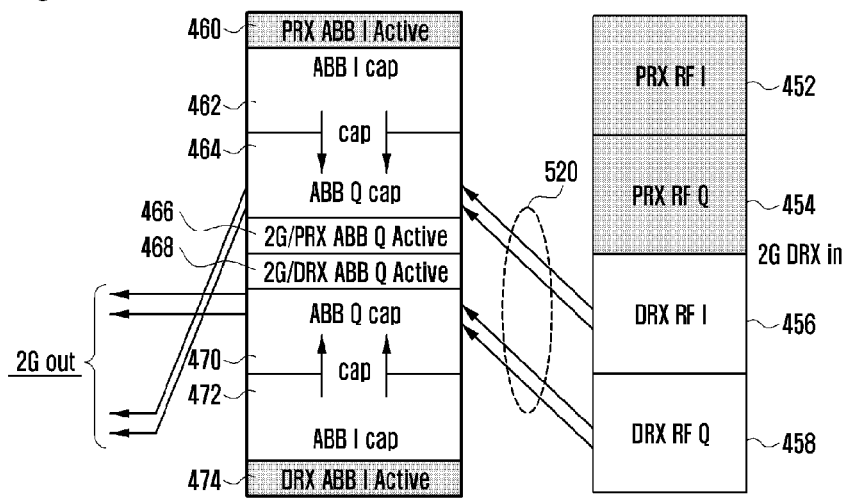

FIGS. 5A to 5C are diagrams illustrating the mode switching of the analog filter according to an embodiment of the present invention. In detail, FIG. 5A shows the signal flows in the 3G/4G mode, FIG. 5B shows the signal flows in the case that the PRX RF I and Q units 452 are used in the 2G mode, and FIG. 5C shows the signal flows in the case that the DRX RF I and Q units 456 and 458 is used in the 2G mode.

Referring to FIG. 5A, the PRX RF I unit 452 receives the RF signal of the PRX HB, down-converts the RF signal to a baseband I signal, and sends the I signal to the first filter block 460 and 462; and the active region 460 and the capacitor region 462 of the first filter block operate for processing the I signal of the PRX HB. The PRX RF Q unit 454 receives the RF signal of the PRX HB, down-converts the RF signal to a baseband Q signal, and sends the Q signal to the second filter block 464 and 466; and the capacitor region 464 and the active region 466 of the second filter block operate for processing the Q signal of the PRX HB.

The DRX RF I unit 456 receives the RF signal of the DRX HB, down-converts the RF signal to a baseband I signal, and sends the I signal to the fourth filter block 472 and 474; and the capacitor region 472 and the active region 474 of the fourth filter block operate for processing the I signal of the DRX HB. The DRX RF Q unit 458 receives the RF signal of the DRX HB, down-converts the RF signal to a baseband Q signal, and sends the Q signal to the third filter block 468 and 470; and the active region 468 and the capacitor region 470 of the third filter block operate for processing the Q signal of the DRX HB.

As described above, the PRX and DRX paths operate independently in the 3G/4G mode such that the outputs of the RF units 452, 454, 456, and 458 are sent to the corresponding filter blocks 460 to 474 by means of the switching unit 500.

As shown in FIGS. 5B and 5C, the input signals are sent to the PRX RF units 452 and 454 or the DRX RF units 456 and 458 in the 2G mode so as to achieve universality. In the case of using the PRX RF units 452 and 454 in the 2G mode, the DRX RF units 456 and 458 are turned off to minimize unnecessary power consumption. In contrast, the PRX RF units 452 and 454 are turned off to minimize the unnecessary power consumption in the case of using the DRX RF units 456 and 458 in the 2G mode.

For the filter inputs from the PRX RF units 452 and 454, the switching unit 510 establishes channels between the PRX RF units 452 and 454 and some regions 462 to 472 of the filter blocks as shown in FIG. 5B.

In detail, the PRX RF I unit 452 receives the RF signal of the LB, down-converts the RF signal to a baseband I signal, and sends the I signal to the third filter block 468 and 470 via the switching unit 510; and the capacitor region 472 of the third filter block is connected to the capacitor region 472 of the fourth filter block such that the active region 468 and the capacitor region 470 of the third filter block and the capacitor region 472 of the fourth filter block operate for processing the I signal of the LB. At this time, the variable capacitors included in the capacitor region 472 of the fourth filter block are controlled by means of the control signal of the active region 468 of the third filter block. The active region 474 of the fourth filter block may enter the idle state to minimize unnecessary power consumption.

The PRX RF Q unit 454 receives the RF signal of the LB, down-converts the RF signal to a baseband Q signal, and sends the Q signal to the second filter block 464 and 466; and the capacitor region 464 of the second filter block is connected to the capacitor region 462 of the first filter block such that the capacitor region 462 of the first filter block and the capacitor region 464 and active region 466 of the second filter block operate for processing the Q signal of the LB. At this time, the variable capacitors included in the capacitor region 462 of the first filter block are controlled by means of the control signal of the active region 466 of the second filter block. The active region 460 of the first filter block may enter the idle state to conserve power.

For the filter inputs from the DRX RF units 456 and 458, the switching unit 520 establishes channels between the DRX RF units 456 and 458 and some regions 462 to 472 of the filter blocks as shown in FIG. 5C.

In detail, the DRX RF I unit 456 receives the RF signal of the LB, down-converts the RF signal to a baseband I signal, and sends the I signal to the second filter block 464 and 466 via the switching unit 520; and the capacitor region 464 of the first filter block is connected to the capacitor region 462 of the first filter block such that the capacitor region 462 of the first filter block and the capacitor region 464 and active region 466 of the second filter block operate for processing the I signal of the LB. At this time, the active region 460 of the first filter block may enter the idle state to conserve power.

The DRX RF Q unit 458 receives the RF signal of the LB, down-converts the RF signal to a baseband Q signal, and sends the Q signal to the third filter block 468 and 470; and the capacitor region 470 of the third filter block is connected to the capacitor region 472 of the fourth filter block such that the active region 468 and capacitor region 470 of the third filter block and the capacitor region 472 of the third filter block operate for processing the Q signal of the LB. At this time, the active region 474 of the fourth filter block may enter the idle state to conserve power.

As described above, the capacitors on the neighbor path are connected to the capacitors on the signal path for the 2G mode in parallel so as to secure extended capacitance for processing the signal of the 2G mode. As a consequence, it is possible to receive the low band signal efficiently using the extended capacitance.

The frequency range may be extended up to three times by controlling individual capacitor banks to make it possible to support the frequency range of up to 6 times through capacity sharing. In addition, by replacing the resistors constituting the analog filter with four resistor segments connected in series and parallel, it is possible to increase the resistance up to 16 times. In this way, the frequency range is extended up to 96 times.

Figure 6:
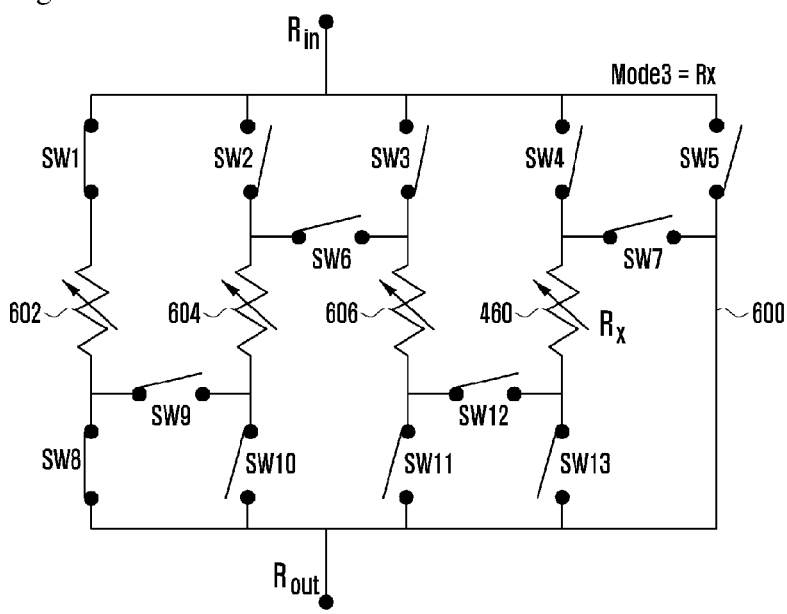
FIG. 6 is a circuit diagram illustrating a resister block varying in resistance depending on the operation mode according to an embodiment of the present invention.

FIG. 6 is a circuit diagram illustrating a resister block varying in resistance depending on the operation mode according to an embodiment of the present invention. The resistor block may substitute for at least one of the input resistor Ra and the feedback resistor Rb constituting an analog filter and controlled depending on the gain, cutoff frequency, or operation mode.

Referring to FIG. 6, the resister block 600 includes four variable resistor segments 602, 604, 606, and 608 connected between the input terminal $R_{in}$ and the output terminal $R_{out}$ in parallel, the input nodes of resistor segments 602 to 608 are connected to the input terminal by means of the switches SW1 to SW4, and the output nodes of the resistor segments 602 to 608 are connected to the output terminal by means of the switches SW8 to SW13. The switch SW9 is interposed between the output nodes of the first and resistor segments 602 and 604, the switch SW6 between the input nodes of the second and third resistor segments 604 and 606, and the switch SW12 between the output nodes of the third and fourth resistor segments 606 and 608. The switch SW5 is arranged in parallel with the resistor segments 602 to 608, and the switch SW7 is interposed between the input node of the fourth resistor segment 608 and the output node of the switch SW5.

Assuming that each resistor segment has the resistance of Rx, the switches SW1 to SW13 are controlled depending on the gain, cutoff frequency, and operation mode such that the total resistance of the resistor block varies in the range from ¼ to 4 times the Rx.

In the embodiment of FIG. 6, only the switches SW1 to SW8 are on while the others are off. Accordingly, the total resistance becomes Rx by the first resistor segment 602. Likewise, the total resistance of the resistor block can be controlled within the range of ¼ to 4 times of Rx by through on/off control of the switches.

FIGS. 7A to 7F are circuit diagrams illustrating various configurations of the resistor block according to an embodiment of the present invention.

Figure 7A:
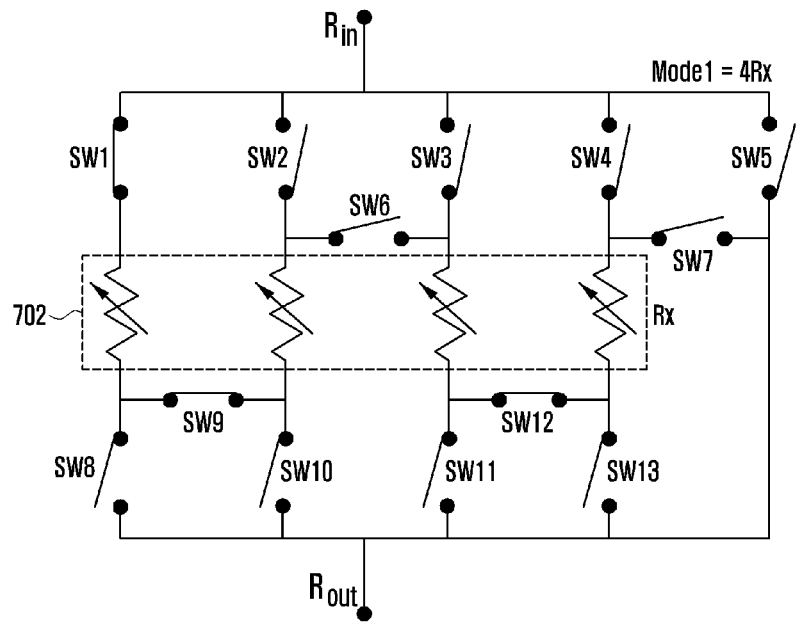
FIGS. 7A to 7F are circuit diagrams illustrating various configurations of the resistor block according to an embodiment of the present invention.

FIG. 7A shows the resistor block configured for the mode 1 for processing LB signals such as 2G mode in which the four resistor segments 702 are connected in series by means of the switches SW1, SW9, SW 6, SW 12, and SW 7 while other switches are off such that the total resistance becomes 4Rx.

Figure 7B:
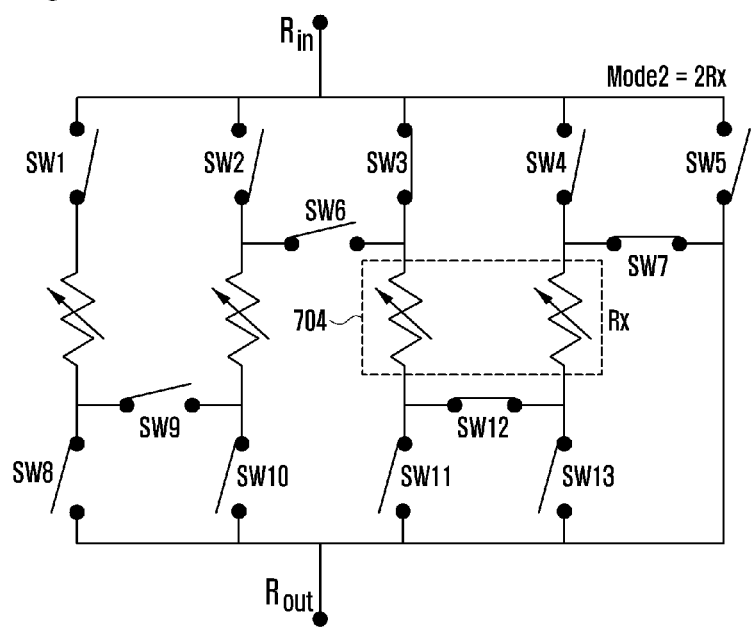

FIG. 7b shows the resistor block configured for mode 2 in which the third and fourth resistor segments 704 are connected in series by means of the switches SW3, SW12, and SW7 while the other switches are off such that the total resistance becomes 2Rx.

Figure 7C:
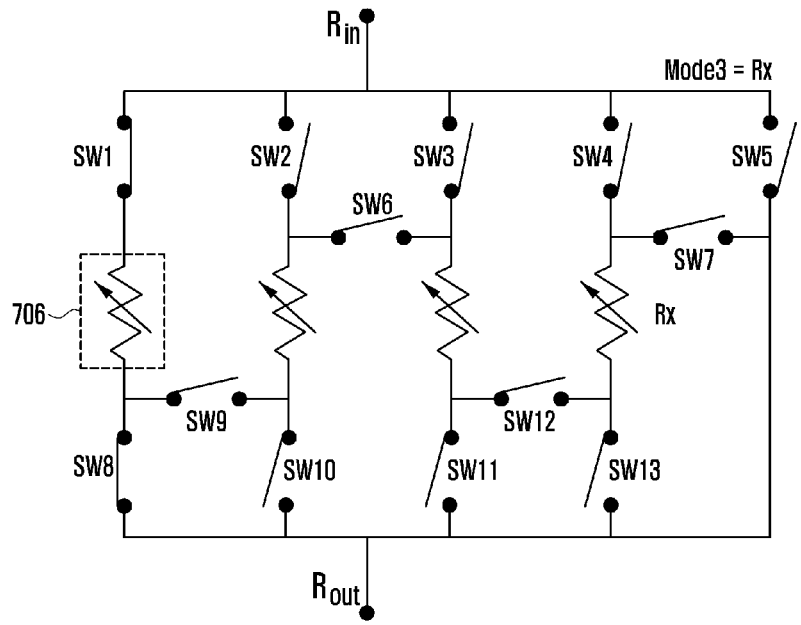

FIG. 7C shows the resistor block configured for mode 3 in which only the first resistor segment 706 connects the input and output terminals by means of the switches SW1 and SW8 while other switches are off such that the total resistance becomes Rx.

Figure 7D:
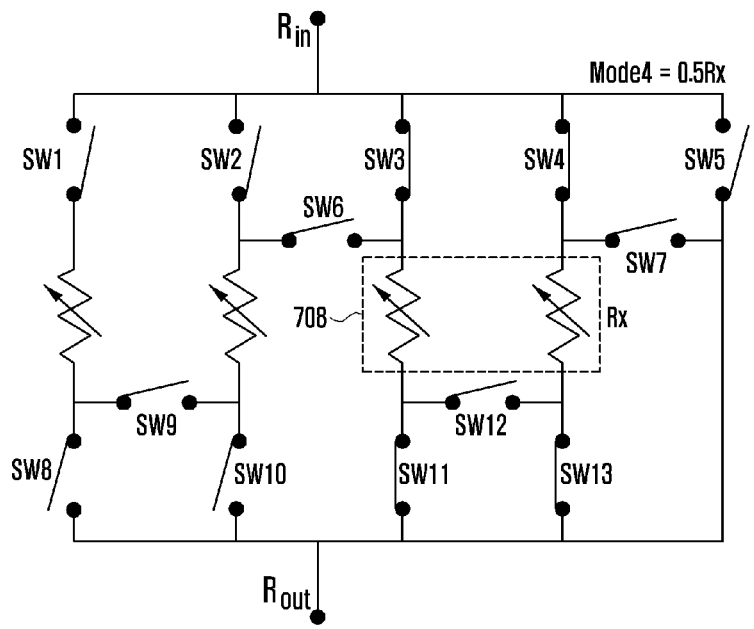

FIG. 7D shows the resistor block configured for mode 4 in which the third and fourth resistor segments 708 are connected in parallel between the input and output terminals by means of the switches SW3, SW11, SW4, and SW13 while other switches are off such that the total resistance becomes 0.5Rx.

Figure 7E:
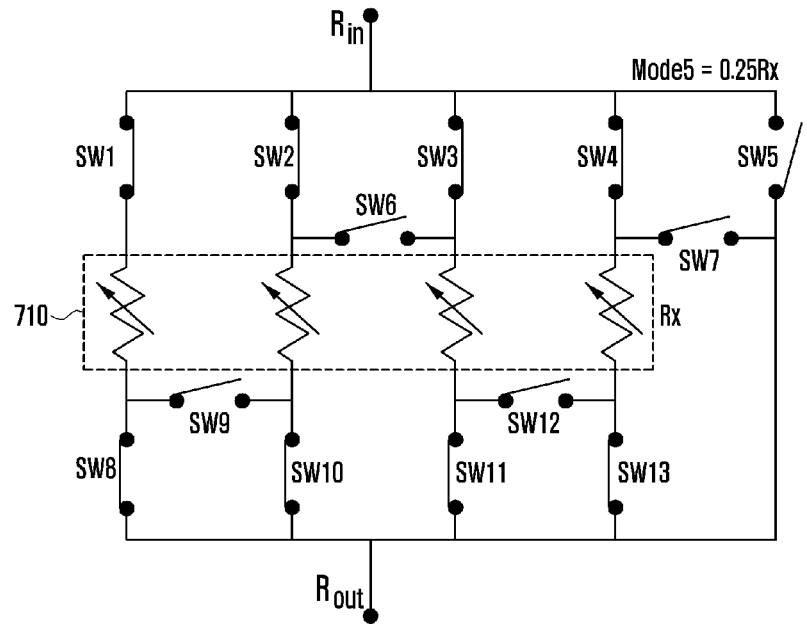

FIG. 7E shows the resistor block configured for mode 5 in which the four resistor segments 710 are connected in parallel between the input and output terminals by means of the switches SW1, SW2, SW3, SW4, SW8, SW10, SW11, and SW13 while other switches are off such that the total resistance becomes ¼Rx.

Figure 7F:
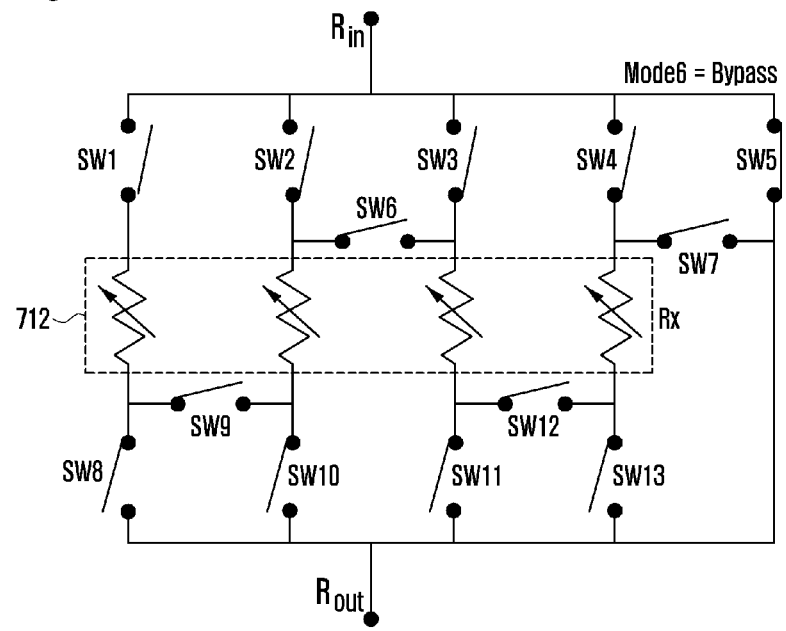

FIG. 7F shows the resistor block configured for mode 6 in which all switches are off with the exception of the switch SW5 such that the input and output terminal are connected directly without interposition of the resistor segments 712.

The Rx of the unit resistor segment is determined variably depending on the gain required by each filter and, since the typically intended gain range is −12~+24 dB, the ratio between the input resistor segments and the feedback resistor segments.

Figure 8:
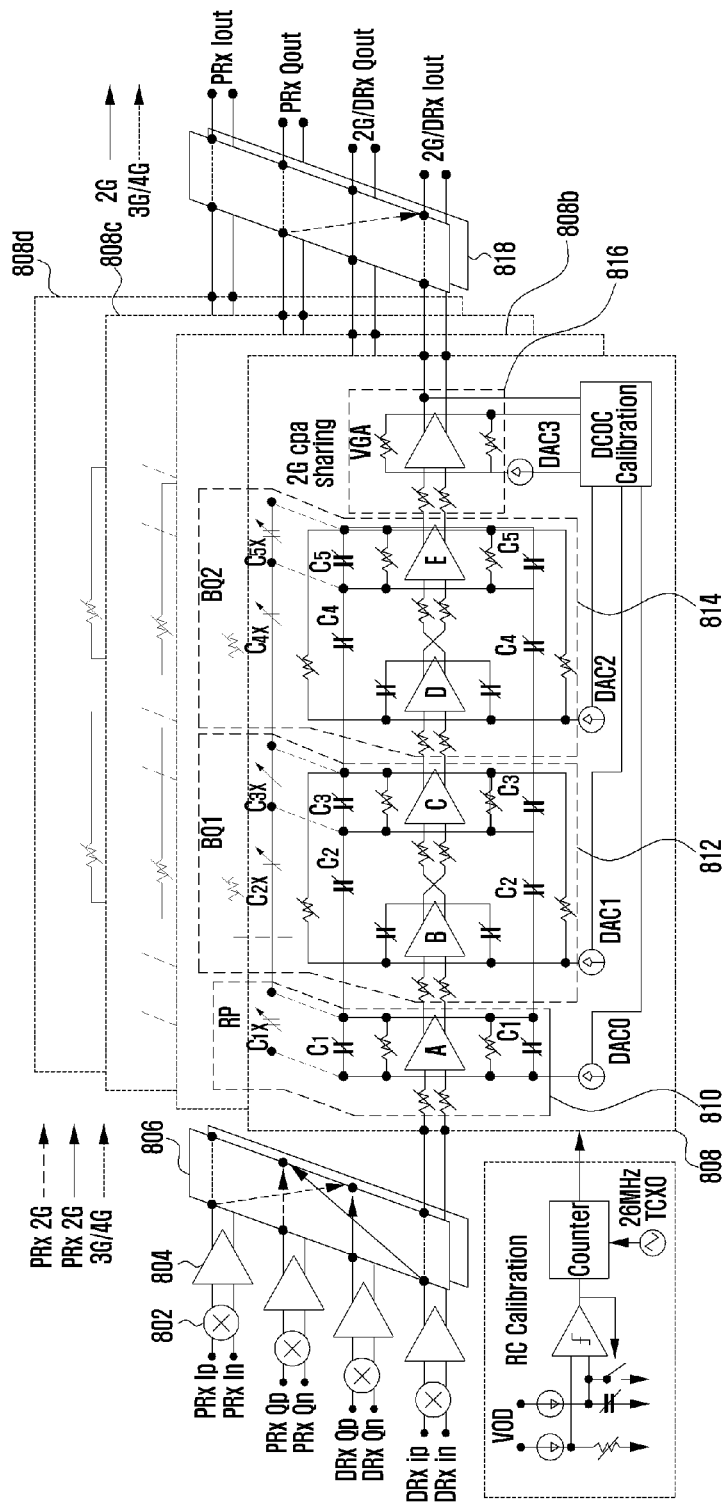
FIG. 8 is a circuit diagram illustrating a configuration of the analog baseband filter according to an embodiment of the present invention.

FIG. 8 is a circuit diagram illustrating a configuration of the analog baseband filter according to an embodiment of the present invention.

Referring to FIG. 8, the analog baseband filter includes four filter blocks 808a, 808b, 808c, and 808d; and the DRX I and Q signals and PRX Q and I signals are input to the input switching unit 806 via the respective frequency convertors 802 and amplifiers 804. The input switching unit 806 relays the input signals to at least two of the filter blocks 808a to 808d depending on the current communication mode under the control of a control unit (not shown). In the 3G/4G mode, the input switching unit 806 relays the 4 input signals to the four filter blocks 808a to 808d. In the 2G mode, the input switching unit 806 delivers the 2G I and Q signals input from the DRX RF unit through the DRX I and Q input nodes to the second and third filter blocks 808b and 808c, i.e., the 2G Q signal from the DRX RF Q unit to the second block 808b and the 2G I signal from the DRX RF I unit to the third filter block 808c. In another embodiment, in the 2G mode, the input switching unit 806 relays the 2G I and Q signals input from the PRX RF unit through the PRX I and Q input nodes to the second and third filter blocks 808b and 808c, i.e. the 2G Q signal from the PRX RF Q unit to the third filter block 808c and the 2G I signal from the PRX RF I unit to the second filter block 808b.

The first filter block 808a is described as a representative filter block hereinafter. The first filter block 808a includes three filter stages (i.e. RF filter 810, BQ first filter 812, and second BQ filter 814) and an amplifier stage 816. The filter stages 810, 812, and 814 of the first filter block 808a operate alone in the 3G/4G mode but are not connected to the filter stages of the second filter block 808b. In the 2G mode, the capacitors C1 of the RP filter 810 cuts of its connection to the OP AMP A and connects to the capacitors C1x included in the RP filter of the second filter block 808b in parallel, and the OP AMP A turns off. Likewise, in the 2G mode, the capacitors C2, C3, C4, and C5 of the next filter stages 812 and 814 cuts off their connection to the OP AMPs B, C, D, and E and connect to the capacitors C2x, C3x, C4x, and C5x corresponding to the second filter block 808b in parallel.

The output signals of the filter blocks 808a to 808d are delivered to the corresponding output terminals through the output switching unit 818 under the control of the control unit. In the 3G/4G mode, the output switching unit 818 delivers the output signals from the filter blocks 808a to 808d to the respective DRX I output, DRX Q output, PRX Q output, and PRX I output nodes. In the 2G mode, the output switching unit 818 delivers the output signal from the third filter block 808c to the 2G I output node and the output signal from the second filter block 808b to the 2G Q output.

Figure 9A:
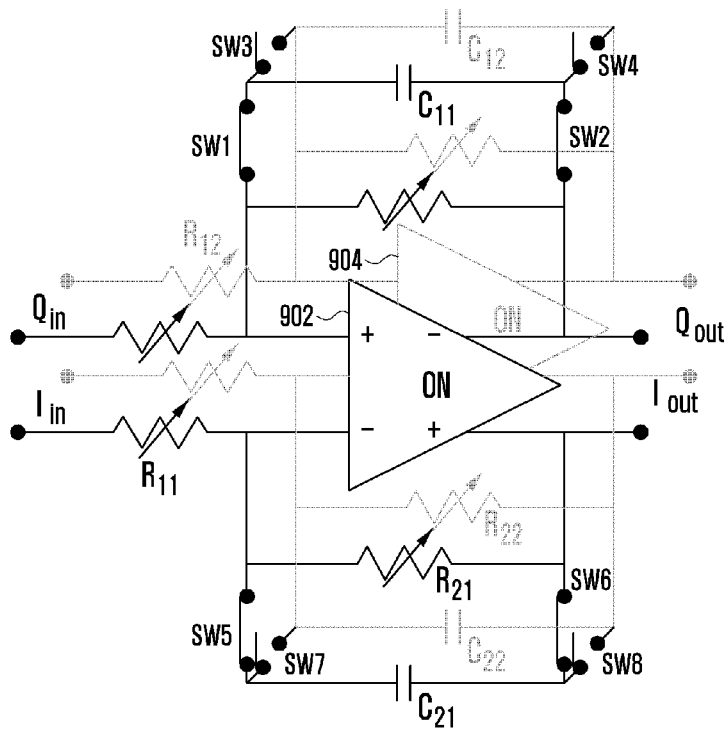
FIGS. 9A and 9B are circuit diagrams illustrating detailed arrangement of the capacitors according to an embodiment of the present invention.
Figure 9B:
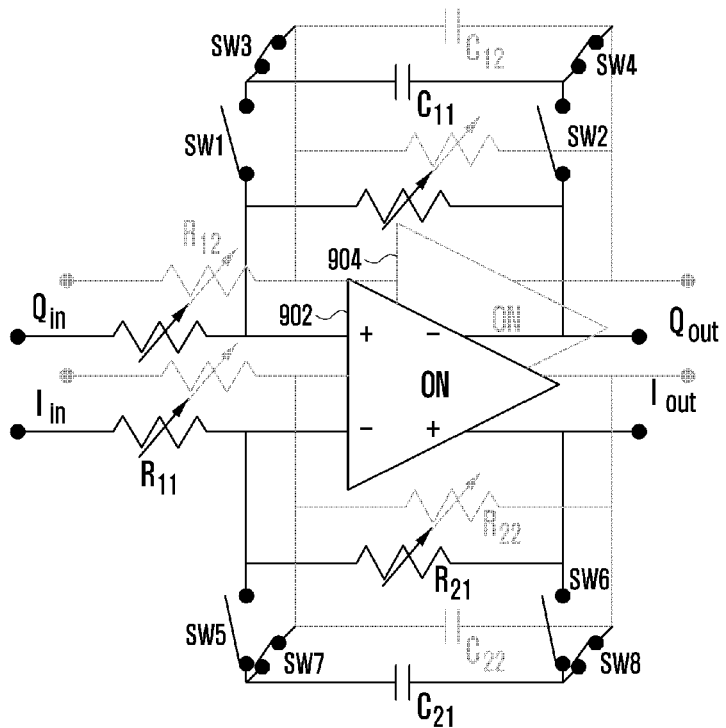

FIGS. 9A and 9B are circuit diagrams illustrating detailed arrangement of the capacitors according to an embodiment of the present invention.

Referring to FIG. 9A, the first OP AMP 902 is positioned in the first filter block 808a and connected to the two capacitors C11 and C21 in parallel. The second OP AMP 904 is positioned in the second filter block 808b and connected to the two capacitors C12 and C22 in parallel. The capacitor C11 is connected in parallel with the first OP AMP 902 by means of the switches SW1 and SW2, the switch SW3 is interposed between the input nodes of the capacitors C11 and C12, and the switch SW4 is interposed between the output nodes of the capacitors C11 and C12. Likewise, the capacitor C21 is connected in parallel with the second OP AMP 902 by means of the switches SW5 and SW6, the switch SW7 is interposed the input nodes of the capacitors C21 and C22, and the switch SW8 is interposed between the output nodes of the capacitors C21 and C22.

In the 3G/4G mode, the switches SW1, SW2, SW5, and SW6 interposed between the capacitors C11 and C21 are on (i.e. closed) while the switches SW3, SW4, SW7, and SW8 interposed between the capacitors C11 and C12 and between C21 and C22 are off (i.e. opened). Accordingly, the capacitors operate in the corresponding filter blocks.

Referring to FIG. 9B, in the 2G mode, the switches SW3, SW4, SW7, and SW8 interposed between the capacitors C11 and C12 and between the capacitors C21 and C22 of different filter blocks are on while the switches SW1, SW2, SW5, and SW6 interposed between the capacitors C11 and C21 of the first filter block 808a and the OP AMP 902 are off. Accordingly, the capacitors C11 and C21 operate in the state of being connected in parallel with the OP AMP 904 of the second filter block 808b other than the first filter block 808a. At this time, the OP AMP 904 of the first filter block 808a may be off to conserve the power. By controlling the other filter stages and capacitors of other filter blocks similarly depending on the communication mode, they can be shared in both the 2G mode and 3G/4G mode.

Figure 10A:
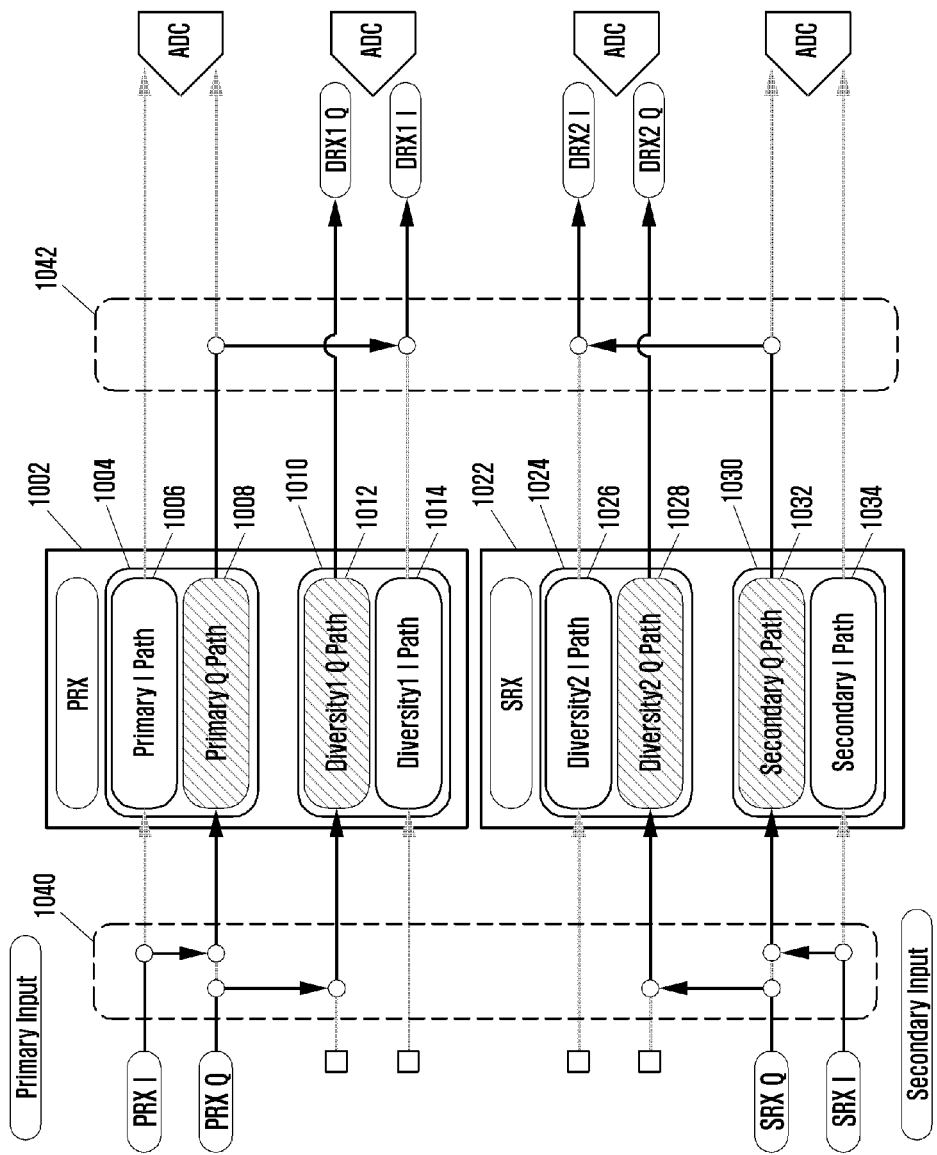
Figure 10C:
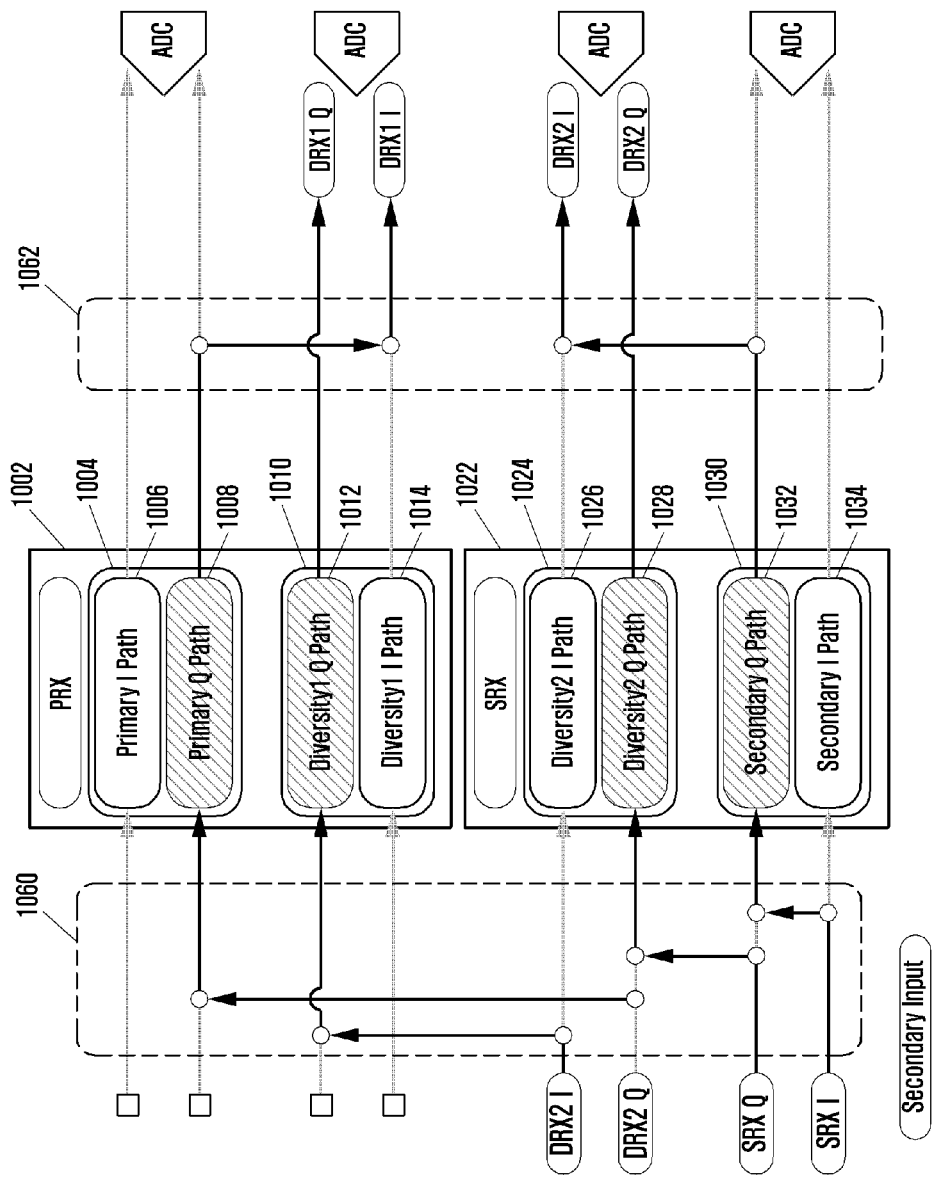

FIGS. 10A to 10C are diagrams illustrating the operation mechanisms of the filter according to an embodiment of the present disclosure. In detail, the drawings show the operations of the filter disclosed in the present invention when at least two signals are input. According to an embodiment, if at least two signals are input, the filter can be used in communication with a communication entity operating in the Carrier Aggregation (CA) mode.

Referring to FIGS. 10a to 10C, the filter module according to an embodiment of the present invention may include at least one of the first switching unit 1040, 1050, and 1060, the filtering unit 1002 and 1022, and the second switching unit 1042, 1052, and 1062. The filtering unit may include at least one filter structured as shown in one of FIGS. 5a to 5c and, in this embodiment, two corresponding filters are included. The first and second filters 1002 and 1022 are configured correspondingly and may perform HB and LB filtering through capacitor sharing as described in the embodiments of the present invention.

In more detail, the filtering unit may include the first filter 1002 and 1022. According to an embodiment, the filtering unit 1002 and 1022 may be positioned on the same path. The first filter 1002 may include a PRX filter 1004 for filtering HB PRX I and Q signals and a DRX 1 filtering unit 1010 for filtering the first DRX (DRX1) I and Q signals. The second filter 1022 may include a DRX 2 filtering unit 1024 for filtering the second DRX (DRX 2) I and Q signals and an SRX filtering unit for filtering the second primary (SRX) I and Q signals. The signals are proposed for describing the embodiment, and the filter may filter various signals according to an embodiment of the present invention. In an embodiment, the filtering units 1004, 1010, 1024, and 1030 may include corresponding I path filtering units 1006, 1014, 1026, and 1032 and corresponding Q filtering units 1004, 1012, 1028, and 1030.

In an embodiment, filtering units may filter the HB input signals input through the I and Q paths and share the capacitors of the I and Q filtering units to filter the LB input signals. In an embodiment, only the filters on one path for the LB filter and, although Q path is activated in the embodiment for explanation, it is possible to activate the I path for filtering the LB signal. In an embodiment, the filtering unit for filtering on each path may be designed such that capacitors can be shared effectively.

The filters of FIGS. 10A to 10C may receive a plurality signals. In an embodiment, it may be considered that a plurality signals are received in the communication system operating in the Carrier Aggregation (CA) mode. In an embodiment, the filter may receive a plurality of LB signals (e.g. 2G signals). The plural LB signals may be the 2G signals received in the CA mode. In an embodiment, the carrier-aggregated signals may be received through an antenna unit (not shown), and the module may control the first switching unit 1040, 1050, and 1060 and the second switching unit 1042, 1052, and 1062 to send the signals to the filtering unit. In an embodiment, the first switching unit 1040, 1050, and 1060 may perform switching to send the received signal to the activated Q path filtering units 1008, 1012, 1028, and 1032. The second switching unit 1042, 1052, and 1062 may perform switching to send the filtered signal to preconfigured ports.

FIG. 10A is directed to an embodiment where a plurality of LB signals are received through PRX and SRX ports. The first switching unit 1040 may be controlled to send the signals to the Q path filtering units 1008, 1012, 1028, and 1030. The first switching unit 1040 may be controlled depending on the signal reception result of a modem (no shown). The second switching unit 1042 may be controlled to send the signals filtered by the Q path filtering units 1008, 1012, 1028, and 1030 to preconfigured ports.

FIG. 10B is directed to an embodiment where a plurality of LB signals are received through PRX and DRX 1 ports. The first switching unit 1050 may be controlled to send the signals to the Q path filtering units 1008, 1012, 1028, and 1030. The first switching unit may be controlled depending on the signal reception result of a modem (not shown). The second switching unit 1052 may be controlled to send the signals filtered by the Q path filtering units 1008, 1012, 1028, and 1030 to preconfigured ports.

FIG. 10C is directed to an embodiment where a plurality of LB signals are received through DRX 2 and SRX ports. The first switching unit 1060 may be controlled to send the signals to the Q path filtering units 1008, 1012, 1028, and 1030. The first switching unit 1060 may be controlled depending on the signal reception result of a modem (not shown). The second switching unit 1062 may be controlled to send the signals filtered by the Q path filtering units 1008, 1012, 1028, and 1030 to preconfigured ports.

Although the description has been directed to the control method depending on the scenario of receiving a plurality of signals, the filtering can be performed in such a way of controlling the switching unit in order for the activated filtering unit to receive the signals transmitted in a method not described in the disclosure.

As described above, a plurality of filtering units having the filters capable of filtering low band signals through capacitors sharing is capable of filtering signals transmitted in carrier aggregation mode.

As described above, the embodiments of the present invention provide receiver systems and digital control code that are capable of sharing capacitor regions for diversity path of the 3G/4G mode, enhancing the input and feedback resistors structure and changing the input and output paths depending on the communication mode. According to various embodiments of the present invention, it is possible to provide a various gain amplifier, filter circuit, and algorithm that is capable of achieving the gain and bandwidth required at the baseband receiver for all the mobile communication standards supported in 2G, 3G, and 4G systems.

Also, the embodiments of the present invention is capable of reducing the circuit area by over half as compared with the conventional technology and applying efficiently to accomplish the MIMO receiver configuration such as 4×2, 4×4, and 8×4 antenna configurations in the next generation mobile communication technologies.

As described above, the analog signal filtering apparatus and method of the present invention is advantageous in terms of providing a variable gain amplifier, filter circuit, and algorithm capable of fulfilling the gains and bandwidths required by the baseband receiver for all mobile communication standards complied by 2G, 3G, and 4G systems.

Also, the analog signal filtering apparatus and method of the present invention is advantageous in terms of implementing the various circuit structures capable of decreasing manufacturing costs and enhancing noise cancellation by decreasing the circuit area as compared to the convention technologies and facilitating application of Multiple Input Multiple Output (MIMO) receiver configurations such as 4×2, 4×4, and 8×4 antenna configurations.

Also, the analog signal filtering apparatus and method of the present invention is advantageous in terms of providing a filter circuit for communication circuit design supporting Carrier Aggregation (CA) for use of carriers on multiple frequency bands.

Although preferred embodiments of the invention have been described using specific terms, the specification and drawings are to be regarded in an illustrative rather than a restrictive sense in order to help understand the present invention. It is obvious to those skilled in the art that various modifications and changes can be made thereto without departing from the broader spirit and scope of the invention.

The invention claimed is:

1. A filtering apparatus of a multimode multiband radio transceiver, the apparatus comprising:
   a filter which filters Radio Frequency (RF) signals on one of at least one frequency bands;
   a switch which switches the RF signals among a plurality of filter blocks included in the filter according to a selected communication mode; and
   at least one processor which selects the communication mode and controls the switch,
   wherein a first filter block of the plurality of filter blocks is configured to be connectable to a capacitor of a second filter block of the plurality of filter blocks.

2. The apparatus of claim 1,
   wherein the filter comprises at least one RF receiver which receives the RF signals as input and outputs baseband signals,
   wherein at least one filter block of the plurality of filter blocks filters and amplifies the baseband signals, and
   wherein the switch connects at least two of the at least one RF receiver to the at least one filter block.

3. The apparatus of claim 2, wherein a capacitor of the first filter block of the at least one filter block is arranged close to the capacitor of the second filter block.

4. The apparatus of claim 2, wherein the at least one RF receiver comprises at least one RF receiver which outputs In Phase (I) and Quadrature Phase (Q) signals corresponding to a RF signal of a primary High Band (HB) among frequency bands in a first communication mode and outputs I and Q signals corresponding to a RF signal of a Low Band (LB) among frequency bands in a second communication mode.

5. The apparatus of claim 4, wherein the capacitor of the first filter block shares active devices of the second filter block close thereto in the second communication mode, the active devices being turned off.

6. The apparatus of claim 5, wherein the at least one processor activates the first and second filter blocks in correspondence to the second communication mode when the at least one RF receiver receives RF signals on at least two LBs, and the switch performs switching to transfer the signals received by the RF receiver to the activated filter blocks.

7. The apparatus of claim 6, further comprising an output switch which connects the signals output from the activated filter blocks to a specific output port.

8. A method for controlling a filtering apparatus of a multimode multiband radio transceiver, the method comprising:
   receiving, at a filter including a plurality of filter blocks, a Radio Frequency (RF) signal on at least one frequency band;
   determining a communication mode based on the received signal;
   switching the received signal among the plurality of filter blocks included in the filter according to the communication mode; and
   filtering and amplifying, at the filter, the received signal,
   wherein a first filter block of the plurality of filter blocks is configured to be connectable to a capacitor of a second filter block of the plurality of filter blocks.

9. The method of claim 8, wherein the filter comprises at least one RF receiver which receives RF signals as input and outputs baseband signals, at least one filter block of the plurality of filter blocks filters and amplifies the baseband signals, the switch connects at least two of the at least one RF receiver to the at least one filter block.

10. The method of claim 9, wherein a capacitor of the first filter block of the plurality of filter blocks is arranged close to the capacitor of the second filter block.

11. The method of claim 9, wherein the at least one RF receiver comprises at least one RF receiver which outputs In Phase (I) and Quadrature Phase (Q) signals corresponding to a RF signal of a primary High Band (HB) among frequency bands in a first communication mode and outputs I and Q signals corresponding to a RF signal of a Low Band (LB) among frequency bands in a second communication mode.

12. The method of claim 11, wherein the capacitor of the first filter block shares active devices of the second filter block close thereto in the second communication mode, the active devices being turned off.

13. The method of claim 11, further comprising:
   activating, at at least one processor, the first and second filter blocks in correspondence to the second communication mode when the at least one RF receiver receives RF signals on at least two LBs; and
   switching, at the switch, the signals received by the RF receiver to the activated filter blocks.

14. The method of claim 13, further comprising connecting signals output from the activated filter blocks to a specific output port by controlling an output switch.

* * * * *